US006772387B1

(12) United States Patent
Plants

(10) Patent No.: US 6,772,387 B1
(45) Date of Patent: Aug. 3, 2004

(54) CYCLIC REDUNDANCY CHECKING OF A FIELD PROGRAMMABLE GATE ARRAY HAVING AN SRAM MEMORY ARCHITECTURE

(75) Inventor: William C. Plants, Santa Clara, CA (US)

(73) Assignee: Actel Corporation, Mountain View, CA (US)

( * ) Notice: Subject to any disclaimer, the term of this patent is extended or adjusted under 35 U.S.C. 154(b) by 0 days.

(21) Appl. No.: 10/351,099

(22) Filed: Jan. 22, 2003

Related U.S. Application Data

(63) Continuation of application No. 09/734,784, filed on Dec. 11, 2000, now Pat. No. 6,560,743, which is a continuation of application No. 09/039,924, filed on Mar. 16, 1998, now Pat. No. 6,237,124.

(51) Int. Cl.[7] .............................................. G11C 29/00
(52) U.S. Cl. ..................................... 714/763; 714/718
(58) Field of Search ................................ 714/799, 704, 714/807, 763, 718, 757, 736, 800, 801, 802

(56) References Cited

U.S. PATENT DOCUMENTS

| | | | |
|---|---|---|---|
| 4,277,844 A | 7/1981 | Hancock et al. ............ 371/38 |
| 4,593,393 A | 6/1986 | Mead et al. .................. 371/37 |
| 4,758,745 A | 7/1988 | Elgamal et al. ............. 307/465 |
| 4,930,097 A | 5/1990 | Ledenbach et al. ......... 364/716 |
| 5,187,392 A | 2/1993 | Allen .......................... 307/465 |
| 5,198,705 A | 3/1993 | Galbraith et al. ........... 307/465 |
| 5,208,491 A | 5/1993 | Ebeling et al. .............. 307/465 |
| 5,222,066 A | 6/1993 | Grula et al. ................. 371/21.1 |
| 5,365,485 A | 11/1994 | Ward et al. ................... 365/221 |
| 5,375,089 A | 12/1994 | Lo ........................... 365/189.04 |
| 5,598,424 A * | 1/1997 | Erickson et al. ............ 714/799 |
| 5,611,042 A | 3/1997 | Lordi ....................... 395/182.04 |
| 5,680,404 A * | 10/1997 | Gray ............................ 714/704 |
| 5,724,370 A * | 3/1998 | Sferrazza et al. ............ 714/807 |
| 5,744,979 A | 4/1998 | Goetting ........................ 326/39 |
| 5,744,980 A | 4/1998 | McGowan et al. ............ 326/40 |
| 5,801,547 A | 9/1998 | Kean ............................. 326/40 |
| 5,815,003 A | 9/1998 | Pedersen ....................... 326/39 |
| 5,815,004 A | 9/1998 | Trimberger et al. .......... 326/41 |
| 5,821,776 A | 10/1998 | McGowan ..................... 326/41 |
| 5,825,200 A | 10/1998 | Kolze ........................... 326/38 |
| 5,825,201 A | 10/1998 | Kolze ........................... 326/39 |
| 5,825,202 A | 10/1998 | Tavana et al. ................ 326/39 |
| 5,825,662 A | 10/1998 | Trimberger .................. 364/491 |
| 5,828,230 A | 10/1998 | Young ........................... 326/41 |
| 5,828,538 A | 10/1998 | Apland et al. ................ 361/56 |
| 5,831,448 A | 11/1998 | Kean ............................. 326/41 |

(List continued on next page.)

FOREIGN PATENT DOCUMENTS

| | | | |
|---|---|---|---|
| EP | 0 415 542 A2 | 7/1990 | ......... H03K/19/173 |
| EP | 0 889 593 A1 | 1/1999 | ......... H03K/19/173 |

*Primary Examiner*—David Ton
(74) *Attorney, Agent, or Firm*—Sierra Patent Group, Ltd.

(57) ABSTRACT

A method for detecting an error in data stored in configuration SRAM and user assignable SRAM in a FPGA comprises the steps of providing a serial data stream into the FPGA from an external source, loading data from the serial data stream into the configuration SRAM in response to address signals generated by row column counters, loading data from the serial data stream into the user assignable SRAM in response to address signals generated by row and column counters, loading a seed and signature from the serial data stream into a cyclic redundancy checking circuit, cycling data out of the configuration SRAM and the user assignable SRAM by the row and column counters; performing error checking on the data that has been cycled out of the configuration SRAM and out of the user assignable SRAM by the cyclic redundancy checking circuit, and generating an error signal when an error is detected by the error checking circuit.

2 Claims, 6 Drawing Sheets

U.S. PATENT DOCUMENTS

| | | | |
|---|---|---|---|
| 5,835,998 A | 11/1998 | Pedersen | 326/40 |
| 5,838,167 A | 11/1998 | Erickson et al. | 326/38 |
| 5,838,584 A | 11/1998 | Kazarian | 364/491 |
| 5,838,954 A | 11/1998 | Trimberger | 395/500 |
| 5,847,441 A | 12/1998 | Cutter et al. | 257/530 |
| 5,847,577 A | 12/1998 | Trimberger | 326/38 |
| 5,848,005 A | 12/1998 | Cliff et al. | 365/230.03 |
| 5,850,151 A | 12/1998 | Cliff et al. | 326/39 |
| 5,850,152 A | 12/1998 | Cliff et al. | 326/40 |
| 5,850,564 A | 12/1998 | Ting et al. | 395/800.37 |
| 5,859,542 A | 1/1999 | Pedersen | 326/39 |
| 5,859,543 A | 1/1999 | Kolze | 326/41 |
| 5,859,544 A | 1/1999 | Norman | 326/40 |
| 5,861,761 A | 1/1999 | Kean | 326/41 |
| 5,869,981 A | 2/1999 | Agrawal et al. | 326/39 |
| 5,870,586 A | 2/1999 | Baxter | 395/500 |
| 5,880,492 A | 3/1999 | Duong et al. | 257/209 |
| 5,880,597 A | 3/1999 | Lee | 326/41 |
| 5,880,598 A | 3/1999 | Duong | 326/41 |
| 5,883,526 A | 3/1999 | Reddy et al. | 326/41 |
| 5,883,850 A | 3/1999 | Lee et al. | 365/230.03 |
| 5,931,959 A | 8/1999 | Kwiat | 714/48 |
| 6,038,627 A | 3/2000 | Plants | 710/126 |
| 6,049,487 A | 4/2000 | Plants et al. | 365/189.04 |
| 6,101,624 A | 8/2000 | Cheng et al. | 714/736 |

\* cited by examiner

CYCLIC REDUNDANCY CHECKING OF A FIELD PROGRAMMABLE GATE ARRAY HAVING AN SRAM MEMORY ARCHITECTURE

CROSS REFERENCE TO RELATED APPLICATIONS

This application is a continuation of application Ser. No. 09/734,784, filed Dec. 11, 2000, now U.S. Pat. No. 6,560,743, which is a continuation of application Ser. No. 09/039,924, filed Mar. 16, 1998, which is issued as U.S. Pat. No. 6,237,124.

BACKGROUND OF THE INVENTION

1. Field of the Invention

The present invention relates to field programmable gate array (FPGA) integrated circuits having an array of logic modules and interconnect architecture configured by static random access memory (SRAM) cells disposed within the array of logic modules. More particularly, the present invention relates to cyclic redundancy checking (CRC) of the contents of the configuration SRAM for the logic modules and interconnect architecture in an FPGA.

2. The Prior Art

One manner known in the art for configuring the logic modules, interconnect and other circuits, such as input/output (I/O) circuits, in an FPGA is with data stored in SRAM cells distributed throughout the FPGA. The SRAM cells employed to configure the FPGA to implement the user-design are typically referred to as configuration SRAM. For reasons of reliability, it is important that the data in the configuration SRAM remains unchanged. Hence, one of the primary disadvantages in using configuration SRAM is that the data in the configuration SRAM is susceptible to an unintended change of at least one bit, known as single event upset (SEU).

In certain high reliability applications the undetected occurrence of a SEU is not considered acceptable. The reluctance among design engineers to use SRAM configured FPGA's in high reliability applications such as space, aeronautics, and military equipment due to the vulnerability to SEU's in harsh environments is well known. Though lowering the probability of an SEU in a harsh environment may be accomplished, eliminating the possibility of an SEU altogether seems unlikely. However, by checking the contents of the configuration SRAM for the FPGA, the detection and correction of an SEU may be accomplished.

In addition to providing SRAM for the configuration of an FPGA, the need for fast, flexible, inexpensive user-assignable SRAM for a variety of purposes such as register files, FIFOs, scratch pads, look-up tables, etc. has become more apparent. Because as integrated circuit technology advances, the shrinking of geometries improves performance and increases densities so that the design of systems of ever increasing complexity and performance at ever decreasing cost is made feasible.

This is especially true in logic products such as Application Specific Integrated Circuits (ASICs), Complex Programmable Logic Devices (CPLDs), and Field Programmable Gate Arrays (FPGAs). There are significant cost and performance savings to be obtained by integrating fast, flexible, inexpensive user-assignable SRAM directly into these types of logic products. However, providing this memory by having other than explicitly dedicated SRAM blocks included in the FPGA has not proved satisfactory. In one case, the implementation of memory without dedicated SRAM blocks has been done using array logic modules and flip-flops.

When user-assignable SRAM is implemented with the logic modules in the FPGA, it requires a substantial amount of the routing and logic resources of the FPGA, and the critical paths are quite long for even a small memory block. This substantially degrades both the performance and flexibility of the FPGA, and offers no density improvement over ordinary FPGA functionality. Further, when the logic blocks are configured as user-assignable SRAM, checking the contents of the configuration SRAM is not readily accomplished, because changing the contents of user-assignable SRAM alters the data in the configuration SRAM.

For example, Xilinx offers the capability on their 4000 series of parts to use the configurable logic blocks as 16×1 user-assignable SRAM blocks, and also offers the ability to check contents of the configuration SRAM. However, when the logic blocks are configured as user-assignable SRAM, checking the data in the configuration SRAM can only be accomplished by providing an additional PROM to mask off those logic modules implemented as SRAM, because changing the SRAM contents alters the data in the configuration memory. The use of a separate PROM is undesirable, because PROMs are expensive, require additional printed circuit board space, and consume I/O pins on the FPGA itself.

It is therefore an object of the present invention to detect and/or correct SEU's to the data in a configuration SRAM of an FPGA.

It is yet another object of the present invention to detect and/or correct SEU's to the data in a configuration SRAM of an FPGA without the need for an additional external component.

It is yet another object of the present invention to detect and/or correct SEU's to fixed data in a user-assignable SRAM of an FPGA.

It is yet another object of the present invention to detect and/or correct SEU's to fixed data in a user-assignable SRAM of an FPGA without the need for an external component.

It is yet another object of the present invention to employ cyclical redundancy checking (CRC) to detect an SEU to the data in a configuration SRAM of an FPGA.

It is yet another object of the present invention to employ cyclical redundancy checking (CRC) to detect an SEU to fixed data in a user-assignable SRAM of an FPGA.

BRIEF DESCRIPTION OF THE INVENTION

According to a first aspect of the present invention, cyclical redundancy checking (CRC) is employed to check for an SEU in the configuration SRAM of an FPGA. In an SRAM based FPGA architecture according to the preferred embodiment of the present invention, an EPROM residing on a printed circuit board near the FPGA stores the configuration data to program the configuration SRAM for the FPGA core. Upon either power up or at device reset, an EPROM controller on the FPGA directs a data stream from the EPROM onto the FPGA. The EPROM controller serializes the data stream from the EPROM into a data stream one bit wide. The data stream is synchronized to an internal clock. The data stream provides data to various portions of the FPGA architecture including control logic, row and column counters, a CRC circuit, and the configuration SRAM for the FPGA core. The control logic is initialized by the first few bits of the data stream, and uses these first few bits of the data stream to control the flow of the data stream into the FPGA.

The CRC circuit tests the data stream from the EPROM to verify that it is correct. The CRC circuit may also test the data in the configuration SRAM after loading. A multiplexer controlled by the control logic selects whether the data to be checked by the CRC circuit is the input data stream or the data in the configuration SRAM. When incorrect configuration data is detected in the configuration SRAM of the FPGA core, the CRC circuit can signal the EPROM controller that an error has occurred. The EPROM controller can use this information to output a signal from the FPGA that an error has occurred and/or initiate a reload from the EPROM.

Once the FPGA enters the normal operating mode, the CRC circuit can be run in the background to continuously verify the contents of the configuration SRAM of the FPGA core. The operation of the CRC circuit during the normal operating mode of the FPGA will be almost completely transparent to the user application.

According to a second aspect of the invention, user-assignable SRAM blocks are included in the SRAM based FPGA architecture and may be included in the CRC checking performed on the configuration SRAM when desired. According to a presently preferred embodiment, 16K bits of SRAM divided into eight dedicated blocks of 2K bits, wherein each SRAM block is organized as 256 words×8 bits, each SRAM block is fully independent from the others, and the SRAM blocks are divided into two groups of four SRAM blocks such that SRAM blocks belonging to a particular group are substantially contiguous to each other. The SRAM blocks form a flexible, high performance memory integrated into the SRAM based FPGA architecture, such that the user-assignable SRAM blocks are disposed between logic function modules in the FPGA core that are partitioned into four groups of multiple logic arrays and are laid out as two upper groups of multiple logic arrays and two lower groups of multiple logic arrays. It is presently contemplated that approximately 50K gates are combined in the four multiple logic arrays.

BRIEF DESCRIPTION OF THE DRAWING FIGURES

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

In an SRAM based FPGA, as discussed above, configuration SRAM hold the configuration data for programming the logic function modules, the interconnect architecture, and other known circuits in an FPGA. In the preferred embodiment, the programmable logic elements in the SRAM based FPGA are pass transistors controlled by the SRAM cells. It should be appreciated that the configuration SRAM is not grouped in a single location on the FPGA, but rather is distributed throughout the FPGA so that typically, the memory cells of the configuration SRAM are in close proximity to the devices the memory cells control.

In an SRAM based FPGA having both configuration SRAM and user-assignable SRAM, according to a first aspect of the present invention, cyclical redundancy checking (CRC) is used to detect whether a SEU has occurred to the data in the configuration SRAM, and according to a second aspect of the present invention, CRC may further be employed to detect whether a SEU has occurred to data in the user-assignable SRAM blocks being employed to maintain fixed data, such as a look-up table. With the use of CRC, the reluctance among design engineers to use SRAM based FPGA's in applications requiring high reliability such as space, aeronautics, and military equipment can be overcome. SEU's can be detected and corrected to ensure reliable operation of the FPGA in harsh environments.

Figure 1:
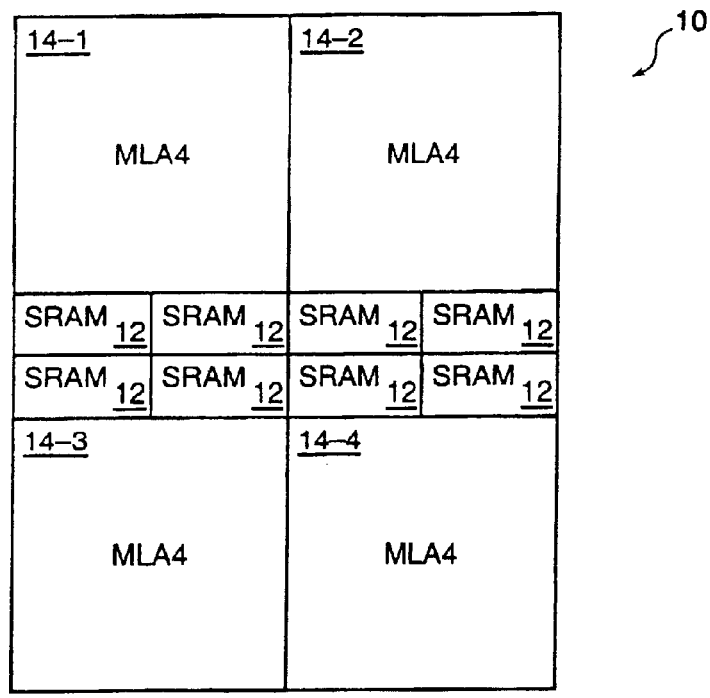
FIG. 1 is a block diagram of an SRAM based FPGA core according to the present invention.

Turning now to FIG. 1 a block diagram of the FPGA core 10 in a flexible, high-performance SRAM based FPGA architecture having user-assignable SRAM blocks 12 according to the present invention is illustrated. The FPGA core 10 includes a plurality of logic function modules arranged in a multi-level architecture (MLA). The blocks 14-1 through 14-4 in FPGA core 10 illustrate a level of the MLA termed MLA4. In the preferred embodiment, there are approximately 50K gates combined in blocks 14-1 through 14-4. The SRAM blocks 12 comprise 16K bits of user-assignable SRAM divided into eight dedicated blocks of 2K bits.

Figure 2:
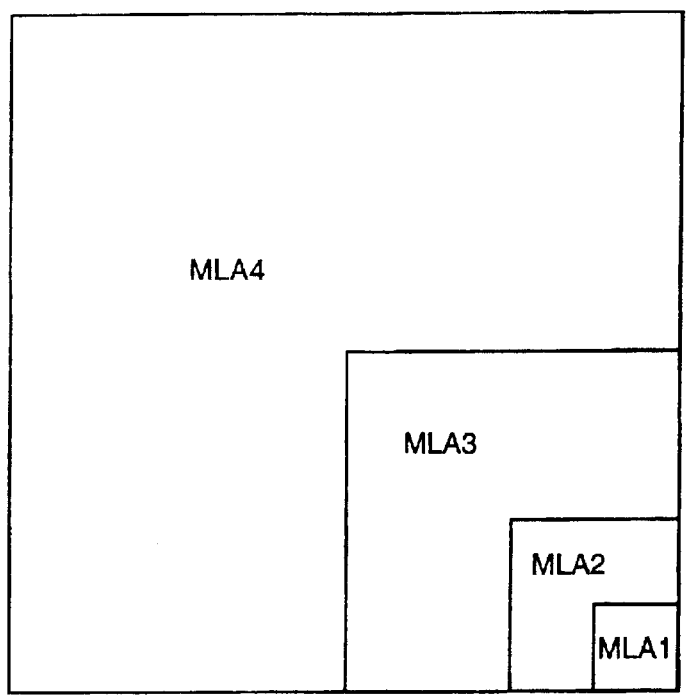
FIG. 2 illustrates a hierarchical embodiment of multiple logic arrays according to the present invention.

The size relationships between the levels MLA1, MLA2, MLA3, and MLA4 in the multi-level architecture are depicted in FIG. 2. In the MLA, each block in a selected level of the MLA includes four blocks from the next lower level in the MLA. The highest level in the MLA is MLA5 comprising all of the logic modules in the FPGA core 10, the SRAM blocks 14, the configuration SRAM, and other circuits in the FPGA.

Figure 3:
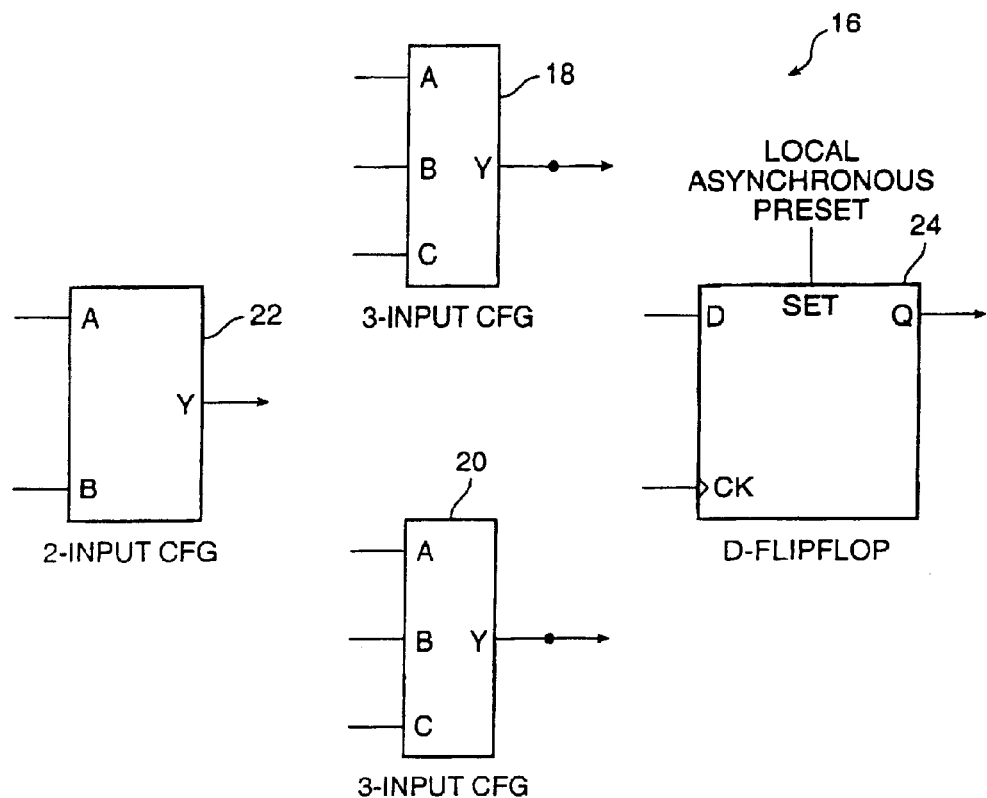
FIG. 3 illustrates in block diagram the logic entities included in a logic module suitable for use according to the present invention.

The smallest grouping of logic modules is a level MLA1 in the MLA. Each MLA1 level includes four blocks having four clusters each. Each of the clusters can be considered as a logic module having four separate logic entities. FIG. 3, illustrates the logic included in a cluster 16 are illustrated. The cluster 16 includes first and second three-input configurable function generators (CFG) 18 and 20, respectively, a two-input CFG 22, and a D-type flip-flop 24. With a three input CFG any three input boolean logic function may be implemented, and with a two input CFG any two input boolean logic function may be implemented. To avoid overcomplicating the disclosure and thereby obscuring the preset invention, many of the details of the entire MLA are not disclosed herein.

Figure 4:
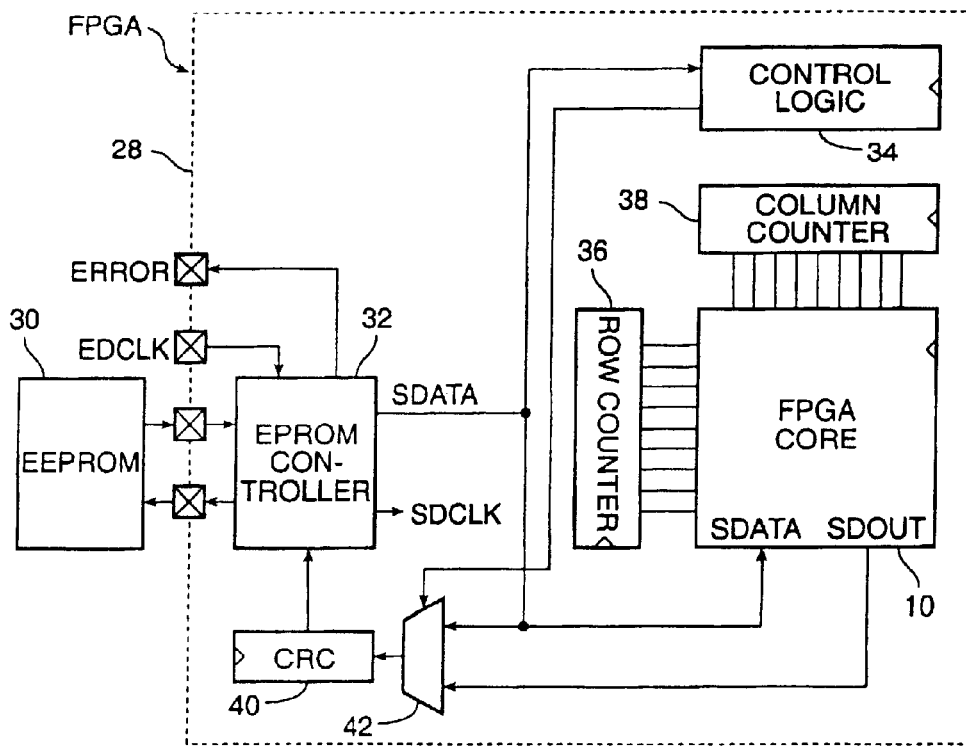
FIG. 4 is a block diagram of an FPGA architecture according to the present invention.

Turning now to FIG. 4, a block diagram illustrates elements of an FPGA 28, according to the present invention, for providing CRC. It should be appreciated, however, that the details of additional circuitry, such as I/O circuitry, used to transport signals onto and off of the integrated circuit containing the FPGA 28 are not provided herein to avoid unnecessarily complicating the disclosure and obscuring the present invention. In FIG. 4, an EPROM 30 residing on a printed circuit board near the FPGA 28 stores the configuration data to implement the user design in the FPGA core 10. Those of ordinary skill in the art will appreciate that an $E^2PROM$ or other suitable memory device, including for example, a data stream on a CPU bus, a serial data stream through a JTAG port, etc., may be employed to provide the configuration data to implement the user design.

Upon either power up or at device reset, an EPROM controller 32 serializes the data stream from the EPROM 30 into a serial data stream (SDATA) one bit wide. It will be appreciated by those of ordinary skill in the art that various EPROM's and $E^2PROM$'s, each with its particular loading mode, are suitable for use in the present invention. The loading of configuration data from various EPROM's and $E^2PROM$'s is well known to those of ordinary skill in the art and will therefore not be disclosed herein. SDATA is synchronized to an internal clock (SDCLK). SDCLK is alternatively generated by an external data clock (EDCLK) or by an oscillator internal to the EPROM controller 32. Those of ordinary skill in the art will appreciate that the source of SDATA will dictate whether SDCLK is provided by EDCLK or an internal oscillator.

SDATA provides data to various circuits of the FPGA 28 including the control logic block 34, the CRC block 40, and the FPGA core 10. Each of these circuits of the FPGA 28 are synchronous to SDCLK for purposes of loading the SDATA and testing the configuration data of the FPGA core 10. The control logic block 34 is initialized by the first few bits of SDATA. The control logic block 34 uses these first few bits of SDATA to control the flow of SDATA to the FPGA core 10, and the CRC block 40. In this manner, the configuration data is loaded into the FPGA core 10 on either power up or reset. To avoid overcomplicating the present disclosure, the control signals generated by the control logic block 34 for directing the sequence of operations, including, loading the data in the FPGA core and performing the CRC, and the specific logic in the control logic block 34 for generating those control signals will not be disclosed herein. The implementation of the control logic for directing the sequence of events is within the level of skill of those of ordinary skill in the art. The circuit employed to load SDATA into the FPGA core 10 and to read SDOUT of the FPGA core 10 in response to the control signals from the control logic 34 and the column address is depicted in FIG. 5B to be described below.

Figure 5A:
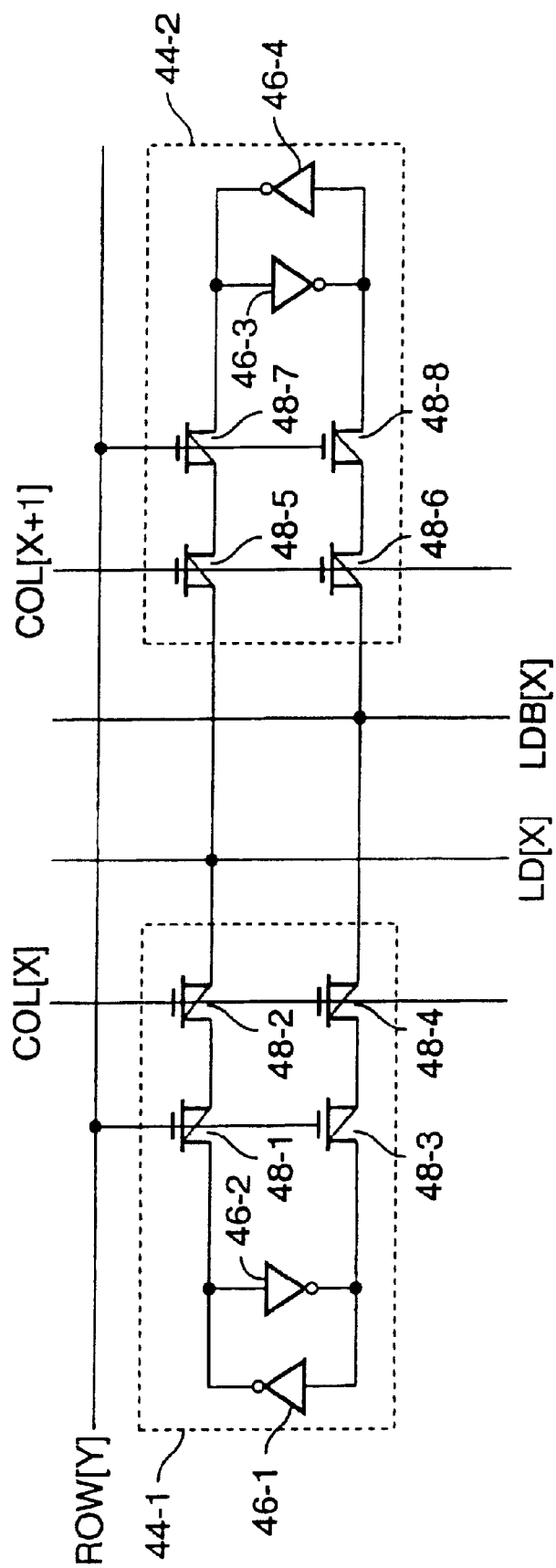
FIG. 5A illustrates a pair of memory cells suitable for use in the present invention.

In FIG. 5A, SRAM memory cells 44-1 and 44-2 suitable for use in the present invention are illustrated. In memory cell 44-1, a bit of data is stored in cross-coupled inverters 46-1 and 46-2, and in memory cell 44-2 a bit of data is stored in cross-coupled inverters 46-3 and 46-4. To access memory cell 44-1 for either a read or a write, ROW <Y> line and COLUMN <X> line must be brought LOW to turn on P-Channel pass transistors 48-1 through 48-4, and to access memory cell 44-2 for either a read or a write, ROW <Y> line and COLUMN <X+1> line must be brought LOW to turn on P-Channel pass transistors 48-5 through 48-8. Data is written into and read from memory cells 44-1 and 44-2 on the LD<X> and LDB<X> lines. A simplified circuit diagram for loading data on the LD<X> line and for sensing data on the LDB<X> line is illustrated in FIG. 5B.

Figure 5B:
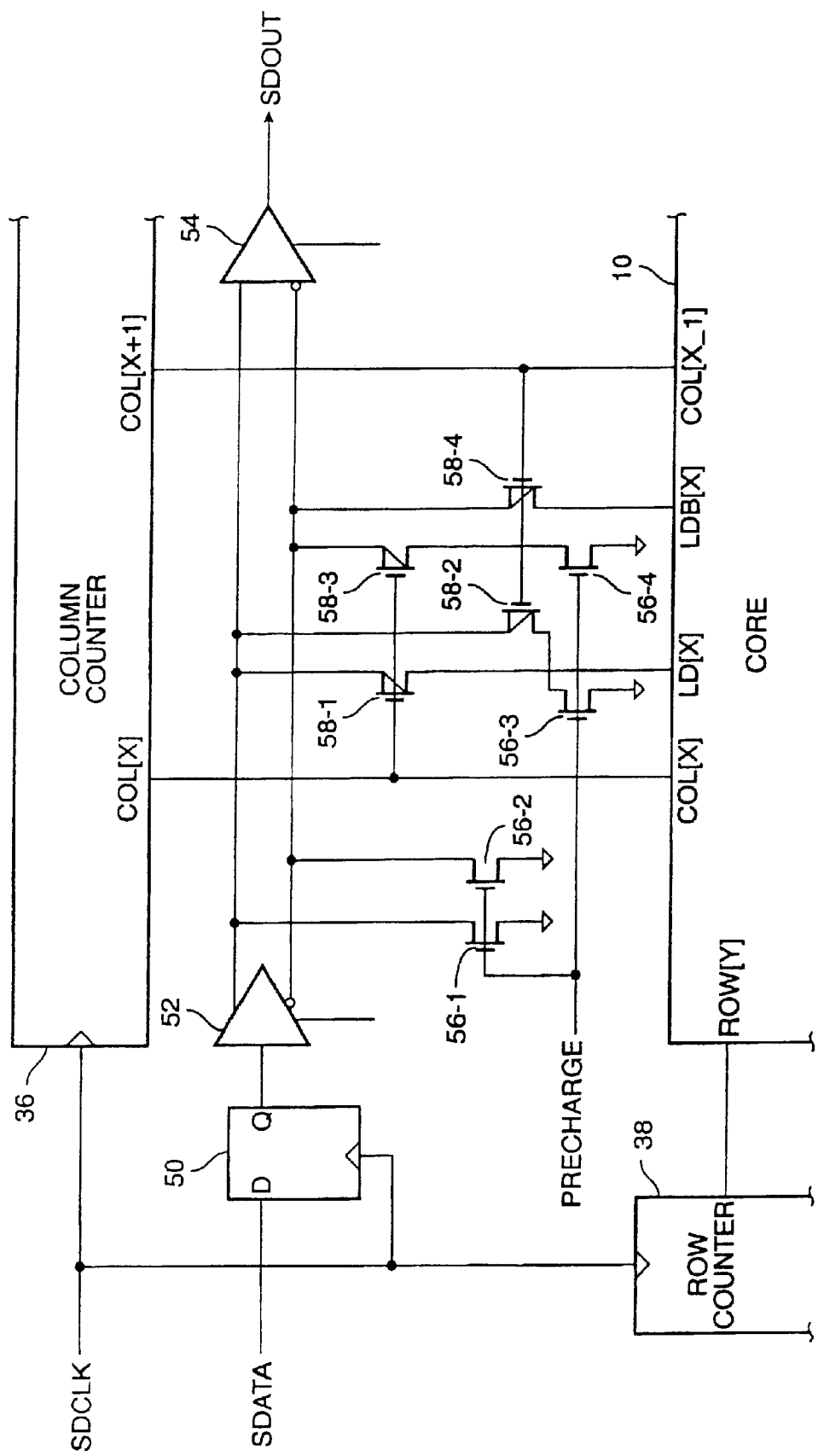
FIG. 5B illustrates a simplified schematic diagram of a circuit for writing the configuration data into and reading the configuration data out of the FPGA core suitable for use according to the present invention.

Turning now to FIG. 5B, the row and column counters 36 and 38, and the FPGA core 10 illustrated in FIG. 4 are shown along with a D-type flip-flop 50, a write amplifier 52 and a sense amplifier 54. SDATA is connected to the data input of D-type flip-flop 50, and the data output of D-type flip-flop 50 is connected to the input of write amplifier 52. A non-inverting output of write amplifier 52 is connected to a non-inverting input of sense amplifier 54, and an inverting output of write amplifier 52 is connected an inverting input of sense amplifier 54. The non-inverting output of write amplifier 52 is also connected to the drain of N-channel MOS pre-charge transistor 56-1, and the drains of P-channel MOS column MUX transistors 58-1 and 58-2. The inverting output of write amplifier 52 is also connected to the drain of N-channel MOS pre-charge transistor 56-2, and the drains of P-channel MOS column MUX transistors 58-3 and 58-4.

The gates and sources of N-channel MOS pre-charge transistors 56-1 through 56-4 are connected to a PRE-CHARGE line and ground, respectively. The drain of N-channel MOS pre-charge transistor 56-3, and the sources of P-channel MOS column MUX transistors 58-1 and 58-2 are connected to the LD<X> line. The drain of N-channel MOS pre-charge transistor 56-4, and the sources of P-channel MOS column MUX transistors 58-3 and 58-4 are connected to the LDB<X> line. The gates of P-channel MOS column MUX transistors 58-1 and 58-3 are connected to the COLUMN<X> line, and the gates of P-channel MOS column MUX transistor 58-2 and 58-4 are connected to the COLUMN<X+1> line.

Read and write operations to and from the FPGA core 10 are performed in a two phase manner. In the first phase, occurring during the first half of a SDCLK cycle, the common outputs and inputs of the write and sense amplifiers 52 and 54, respectively, and the LD<X> and LDB<X> lines are precharged to ground. In the second phase, occurring during the second half of the SDCLK cycle, the actual read or write operation is performed.

To perform a write, the data to be written is clocked into the D-type flip-flop 50 on the rising edge of SDCLK. With the SDCLK signal HIGH, the PRECHARGE is also driven HIGH to drive the common outputs and inputs of the write and sense amplifiers 52 and 54, respectively, and the LD<X> and LDB<X> lines to ground. On the falling edge of the SDCLK signal, the PRECHARGE line goes low to release the common outputs and inputs of the write and sense amplifiers 52 and 54, respectively, and the LD<X> and LDB<X> lines. The COL and ROW lines are asserted at this time to select a single memory cell in the configuration SRAM. The write amplifier 52 drives the appropriate one, dependent upon whether a 1 or a 0 is being written, of the common outputs write amplifier 52 and the associated one of the LD<X> and LDB<X> lines HIGH to perform a write to the selected memory cell of the bit of SDATA stored in the D-type flip-flop 50.

To perform a read, with the SDCLK signal HIGH, the PRECHARGE is driven HIGH to drive the common outputs and inputs of the write and sense amplifiers 52 and 54, respectively, and the LD<X> and LDB<X> lines to ground. On the falling edge of the SDCLK signal, the PRECHARGE line goes low to release the common outputs and inputs of the write and sense amplifiers 52 and 54, respectively, and the LD<X> and LDB<X> lines. The COL and ROW lines are asserted at this time to select a single memory cell in the configuration SRAM. The selected cell will pull the appropriate one, dependent upon whether a 1 or a 0 is being read, of the LD<X> and LDB<X> lines and the associated of input of the sense amplifier 54 HIGH to perform a read of the selected memory cell. In the preferred embodiment, the sense amplifier 54 is implemented as two single ended sense amps, though other sense amplifier designs could be employed as will be appreciated by those of ordinary skill in the art.

To error check the configuration data of the FPGA core 10 by the CRC block 40, the configuration data in the memory cells 44 is sensed by sense amplifier 54 as the row and column counters 36 and 38 cycle through the address space of the FPGA core 10. The output of sense amplifier 54 is fed through multiplexer 42 to the CRC block 40 for error checking.

With a seed and a signature, to be explained below, contained in the SDATA data stream, the CRC block 40 tests the configuration data stored in EPROM 30, and loaded into the FPGA core 10 by EPROM controller 32 to verify that it is correct. In this manner, the CRC block 40 can identify errors in the SDATA loaded into the FPGA core initially. Once the configuration data of the FPGA core 10 is verified by the CRC block 40 as correct, the FPGA 20 enters a normal operating mode and signals to the system that it is ready to proceed.

According to the present invention, when the FPGA 28 enters the normal operating mode, the CRC block 40 can be run in the background to continuously verify the contents of the FPGA core 10. To perform the CRC in the background during normal operation of the FPGA, the row and column counters 36 and 38 are reset and the address space of the configuration SRAM is cycled through while the CRC compares the signature during each cycle period. A multiplexer 42 controlled by the control logic block 34 selects whether the data to be checked by the CRC block 40 is the input SDATA data stream or the configuration data of the FPGA core 10 stored in the configuration SRAM.

When an error in the configuration data of the FPGA core 10 is detected either during power up, reset or the normal operating mode, the CRC block 40 can signal the EPROM controller block 32 that an error has occurred. The EPROM controller 32 can use this information to output a signal from the FPGA 28 to indicate that an error has occurred and/or to initiate a reload from the EPROM 30.

The operation of the CRC block 40 during the normal operating mode of the FPGA will be almost completely transparent to the user application. The overhead for implementing the CRC during normal operation is slight and includes the small amount of power needed to run the internal oscillator, the row and column counters 36 and 38, respectively, the CRC block 40, and sense circuitry in the FPGA core 10. While performing the CRC in the background during normal operation, there is also the possibility that a slight timing performance degradation may occur in a programmable interconnect element controlled by a configuration SRAM cell being read. It should be appreciated that the effect on the timing performance of the programmable interconnect elements may be minimized by the particular implementation of the SRAM cells.

Figure 6A:
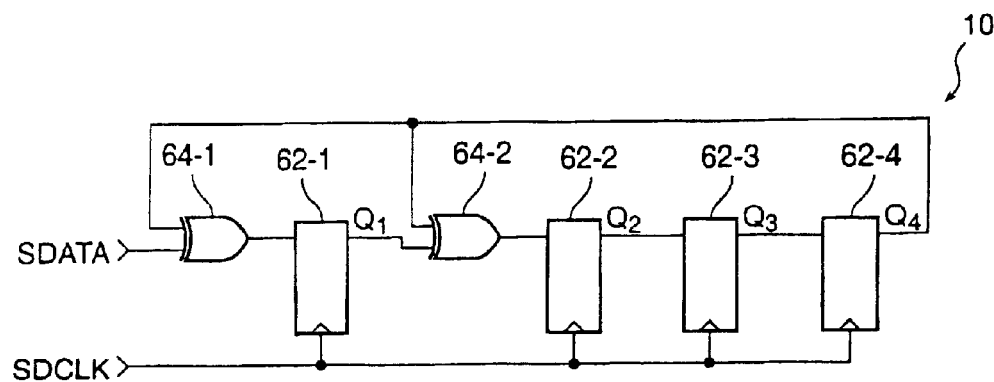
FIG. 6A is a block diagram of an illustrative linear feedback shift register.
Figure 6B:
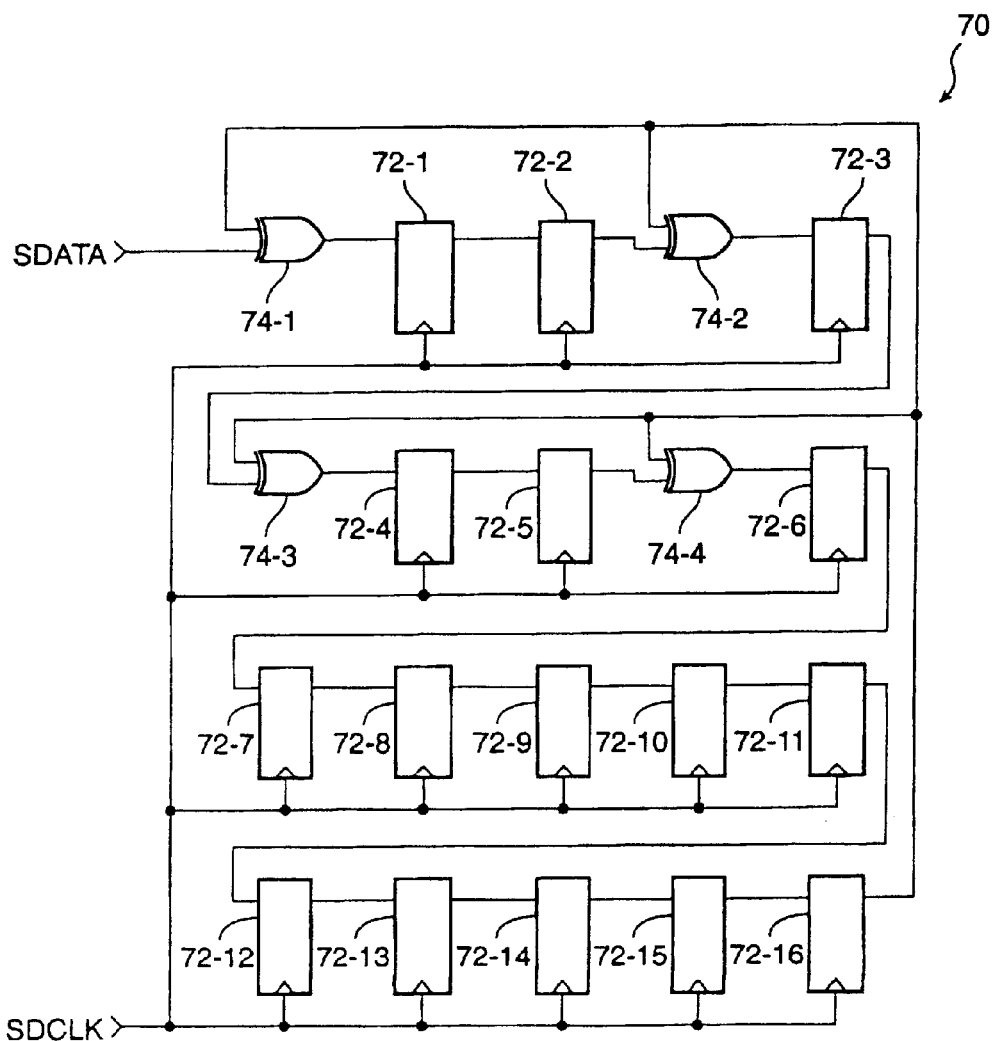
FIG. 6B is a block diagram of a second linear feedback shift register suitable for use in the present invention.

According to the present invention, the CRC block 40 implements a signature analysis which employs a built-in self test technique well known in the art. In the CRC block 40, a linear feedback shift register (LFSR), examples of which are depicted in FIGS. 6A and 6B, is employed to compress the data stream being tested. The value in the LFSR at the start of the test is known as the seed and the value in the register at the end of the test is known as the signature. At the end of the test, the signature is compared to its known correct value. When the values do not match an error will be generated by the CRC block 40.

When the values do match there is a very high probability, when the LFSR is designed properly, that the circuit being tested has performed correctly. The probability of a correct signature analysis test corresponding to correct circuit performance is known as the fault coverage and is usually expressed as a percentage. The fault coverage can never reach 100% because of the possibility that some error might produce the correct signature. This is known as error masking. The details of how to improve the statistical fault coverage of a LFSR are well known to those of ordinary skill in the art.

Turning now to FIG. 6A, an example of a four bit LFSR 60 is illustrated. LFSR 60 comprises flip-flops 62-1 through 62-4 and exclusive-or (XOR) gates 64-1 and 64-2. At the start of the data testing a seed value must be either already present in the LFSR or loaded into the LFSR. As will be appreciated by those of ordinary skill in the art, the seed value may be loaded into the LSFR 60 in parallel or by other known conventional methods so that the desired values Q1 through Q4 are present at the outputs of the flip-flops 62-1 through 62-4.

In LFSR 60, a first XOR gate 64-1 has a first input connected to SDATA and a output connected to the first input of flip-flop 62-1. The output of flip-flop 62-1 is connected to a first input of XOR gate 64-2. Flip-flops 62-2 through 62-4 are connected in series such that the input of flip-flop 62-2 is connected to the output of XOR gate 64-2, the input of flip-flop 62-3 is connected to the output of flip-flop 62-2, and the input of flip-flop 62-4 is connected to the output of flip-flop 62-3. The output of flip-flop 62-4 is fed back to second inputs of XOR gates 64-1 and 64-2. A shorthand notation, well known to those of ordinary skill in the art, describes the configuration of the flip-flops 62-1 through 62-4 and the XOR gates 64-1 and 64-2 in the LFSR 60 with the characteristic polynomial $X^4+X+1$.

It should be appreciated that as data is continuously clocked into the LFSR the contents are shifted to the right while the last bit is fed back into earlier stages of the LFSR to interact with the data from those stages. Thus a very long data stream can be compressed into only four bits. The cyclical nature of this feedback feature is the reason signature analysis is often referred to as CRC.

FIG. 6B shows a 16 bit LFSR 70 comprised of flip-flops 72-1 through 72-16 and XOR gates 74-1 through 74-4, and having a characteristic polynomial $X^{16} +X^5 +X^3 + X^2 +1$. In LFSR 70, XOR gate 74-1 has a first input connected to SDATA and a output connected to the first input of flip-flop 72-1. The output of flip-flop 72-1 is connected to the input of flip-flop 72-2, and the output of flip-flop 72-2 is connected to a first input of a XOR gate 74-2. The input of flip-flop 72-3 is connected the output of XOR gate 74-2, and a first input of XOR gate 74-3 is connected to the output of flip-flop 72-3. The output of XOR gate 74-3 is connected to the input of flip-flop 72-4. The output of flip-flop 72-4 is connected to the input of flip-flop 72-5, and the output of flip-flop 72-5 is connected to a first input of XOR gate 74-4. Flip-flops 72-6 through 72-16 are connected in series such that the input of flip-flop 72-6 is connected to the output of XOR gate 74-4, the input of flip-flop 72-7 is connected to the output of flip-flop 72-6, the input of flip-flop 72-8 is connected to the output of flip-flop 72-7, the input of flip-flop 72-9 is connected to the output of flip-flop 72-8, the input of flip-flop 72-10 is connected to the output of flip-flop 72-9, the input of flip-flop 72-11 is connected to the output of flip-flop 72-10, the input of flip-flop 72-12 is connected to the output of flip-flop 72-11, the input of flip-flop 72-13 is connected to the output of flip-flop 72-12, the input of flip-flop 72-14 is connected to the output of flip-flop 72-13, the input of flip-flop 72-15 is connected to the output of flip-flop 72-14, and the input of flip-flop 72-16 is connected to the output of flip-flop 72-15. The output of flip-flop 72-16 is fed back to second inputs of XOR gates 74-1 through 74-4.

For the four bit LFSR 60 in FIG. 6A, if all error signatures are equally likely (rarely a good assumption) the fault coverage for the four bit LFSR is 93.75%. Those of ordinary skill in the art would not recognize this as a satisfactory result. For the sixteen bit LFSR 70 in FIG. 6B, with the same assumption that all error signatures are equally likely, the fault coverage for the 16 bit LFSR is 99.9985%. Those of ordinary skill in the art would probably recognize this as a reasonable result. Accordingly, in general, as the number of bits in the LFSR increase so does the fault coverage. The exact length and appropriate polynomial required to test a particular design is a matter design choice and further discussion is beyond the scope of the this disclosure. However, it will be appreciated by those of ordinary skill in the art that a prime polynomial would be suitable for use according to the present invention.

According to the present invention, the SRAM based FPGA core 10 illustrated in FIG. 1 includes user-assignable SRAM blocks 12. According to a second aspect of the present invention, data stored in the SRAM blocks 12 that is fixed during the operation of the FPGA 28, for example, for use as a look-up table, may also be included in the CRC of the configuration SRAM.

Referring again to FIG. 1, each user-assignable SRAM block 12 includes 256 words of 8 bits, and each user-assignable SRAM block 12 is fully independent from the other SRAM blocks 12. The eight bits of addressing for each word in an SRAM block 12, and the eight bit word length are convenient for connection to the MLA4 blocks 14-1 through 14-4. It will be appreciated by persons of ordinary skill in the art that SRAM blocks 12 which are either larger or smaller than 2 k bits may be utilized, and further that either fewer or greater than eight SRAM blocks 12 may be employed. The number of words in an SRAM block 12, the length of a word in an SRAM block 12, the number of bits in an SRAM block 12, and the number of SRAM blocks 12 are a matter of design choice.

In the FPGA core 10, the SRAM blocks 12 are split into two groups of four SRAM blocks 12. A first group of four SRAM blocks 12 is disposed between MLA4 blocks 14-1 and 14-3, and a second group of four SRAM blocks 12 is disposed between MLA4 blocks 14-2 and 14-4. The SRAM blocks 12 in each of the groups are substantially contiguous to the extent that the address busses, data busses, and control signal lines of each of the SRAM blocks 12 in a group can be commonly connected to facilitate combining the user-configurable SRAM blocks 12 in a group into wider and/or deeper user-assignable memory configurations. Further, the two groups can be connected together, if desired, through the logic modules and the general interconnect resources of the MLA.

Figure 7:
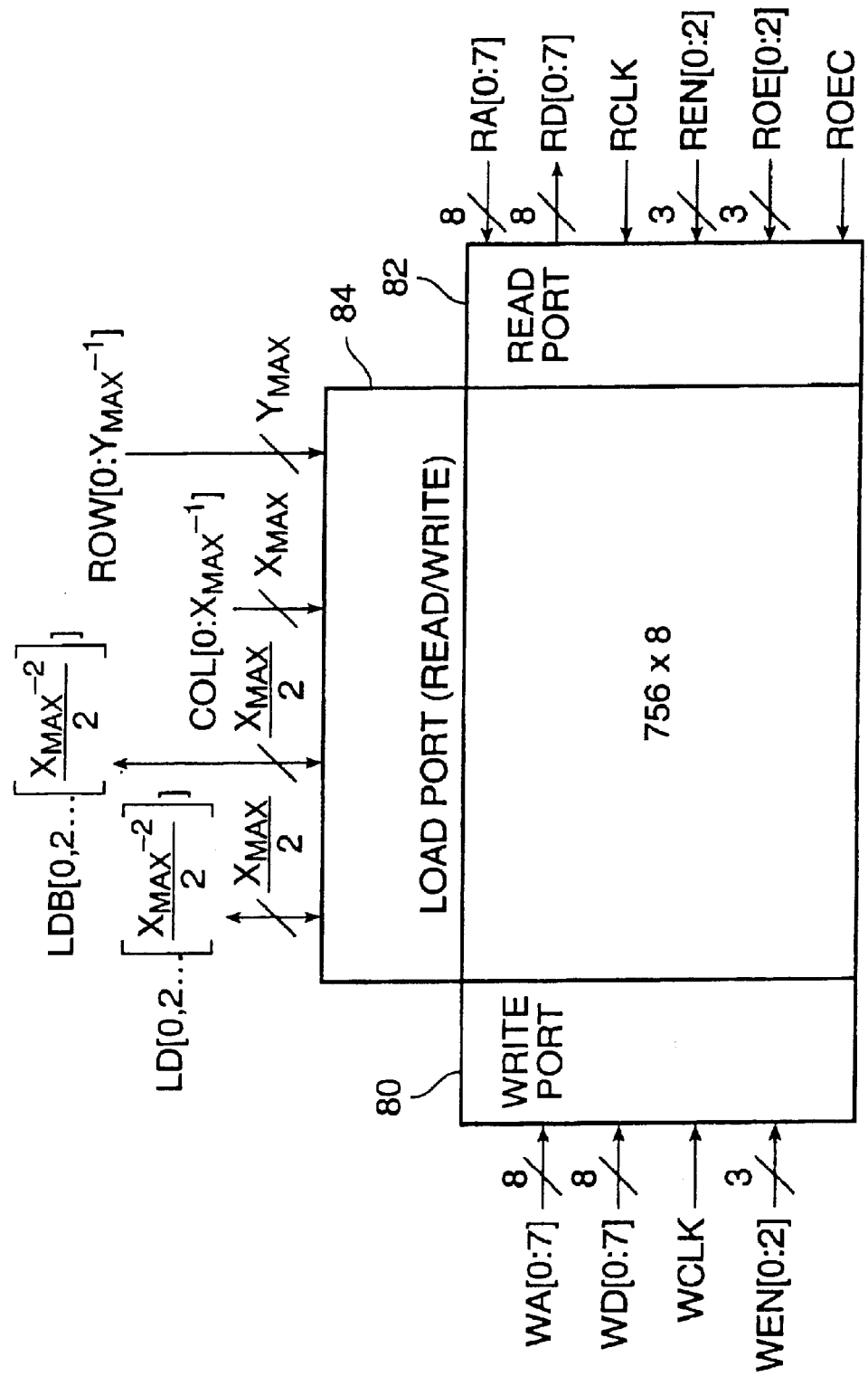
FIG. 7 is a block diagram of an SRAM depicting a write port, read port and load port, according to the present invention.

As depicted in FIG. 7, each SRAM block 12 may be user-assignable through write and read ports 80 and 82, respectively. Connected to write port 80 are an eight bit write address (WA) bus, an eight bit write data (WD) bus, a write clock (WCLK) control signal, and a three bit write enable (WEN) control signal bus, and connected to the read port 82 are an eight bit read address (RA) bus, an eight bit read data (RD) bus, a read clock (RCLK) control signal, a three bit read enable (REN) control signal bus, a three bit read output enable (ROE) control signal bus, and read output enable control (ROEC) signal.

To avoid over complicating the present disclosure and obscuring the present invention, the user-assignability aspects of the SRAM modules 12, and the connection of the write and read ports 80 and 82, respectively, of the SRAM blocks 12 to the SRAM bus architecture of the FPGA 28 will not be disclosed herein. These details are disclosed in co-pending application Ser. No. 09/039,923, filed Mar. 16, 1998, (entitled "SRAM BUS ARCHITECTURE AND INTERCONNECT TO AN FPGA", by inventor William C. Plants, and filed the same day as this application and assigned to the assignee of the present invention and specifically incorporated herein by reference, and in co-pending application Ser. No. 09/039,891, filed Mar. 16, 1998, (entitled "EMBEDDED STATIC RANDOM ACCESS MEMORY FOR FIELD PROGRAMMABLE GATE ARRAY", by inventors William C. Plants, Jim Joseph, and Anthony Bell and filed the same day as this application, and assigned to the assignee of the present invention and specifically incorporated herein by reference.

Turning again to FIG. 7, a load port 84 is also depicted in each of the SRAM blocks 12. Connected to the load port 84 are a column address bus, a row address bus, a LD bus, and a LDB bus. The load port 84 is controlled by the circuitry illustrated in the FIGS. 4 and 5B employed to load the configuration data into the configuration SRAM.

As described above, according to a first aspect of the present invention, the configuration data for the FPGA core 10 is stored in the configuration SRAM, and as described above, during the normal operation of the FPGA 28, the configuration data is cycled out of the configuration SRAM for testing by the CRC block 40 to determine whether an error in the configuration data has occurred.

It should be appreciated that the user-assignable SRAM blocks 12 do not contain any of the configuration data. However, through the load port 84, data can be preloaded into the user-assignable SRAM blocks 12 during the configuration of the FPGA 28. Further, the data loaded into the SRAM blocks 12 can also be cycled out of the SRAM blocks 12 to be checked by the CRC block 40. The data is stored and cycled out of the SRAM blocks 12 through the load port 84 according to the addresses supplied to the load port 84 on the row address and column address busses by the row and address counters 36 and 38, respectively.

According to this aspect of the present invention, the row and address counters 36 and 38 include bits to control the cycling through the address space implemented by the SRAM blocks 12. The address counters 36 and 38 according to the present invention may be programmed so that only data contained in the desired SRAM blocks 12 containing fixed data will be cycled out of the SRAM blocks 12 for checking by the CRC circuitry of the present invention.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A method for detecting an error in data stored in a configuration static random access memory and a user assignable static random access memory in a field programmable gate array comprising:

receiving a serial data stream into said field programmable gate array from an external source;

cycling said serial data stream through a cyclic redundancy checking circuit to perform error checking on said serial data stream; and generating an error signal responsive to an error detected by said cyclic redundancy checking circuit.

2. A The method of error detection as recited in claim 1, further including the step of loading a seed and signature from said serial data stream into said cyclic redundancy checking circuit.

* * * * *